United States Patent
Watanabe et al.

(10) Patent No.: US 8,411,197 B2
(45) Date of Patent: Apr. 2, 2013

(54) IMAGE PICKUP DEVICE AND PRODUCTION METHOD THEREOF

(75) Inventors: Naoyuki Watanabe, Kawasaki (JP); Toshiyuki Honda, Kawasaki (JP); Yoshito Akutagawa, Kawasaki (JP); Susumu Moriya, Kawasaki (JP); Izumi Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1031 days.

(21) Appl. No.: 10/968,111

(22) Filed: Oct. 20, 2004

(65) Prior Publication Data

US 2005/0275741 A1  Dec. 15, 2005

(30) Foreign Application Priority Data

Jun. 15, 2004 (JP) ................................. 2004-177598

(51) Int. Cl.
- *H04N 5/68* (2006.01)
- *H04N 5/225* (2006.01)
- *H01L 21/00* (2006.01)
- *H01L 23/02* (2006.01)

(52) U.S. Cl. ........... 348/374; 348/340; 438/74; 257/680

(58) Field of Classification Search .................. 348/374, 348/340; 257/680, 432; 438/74, 22–24; 250/208.1

See application file for complete search history.

(56) References Cited

U.S. PATENT DOCUMENTS

| | | | | |
|---|---|---|---|---|
| 4,418,284 A * | 11/1983 | Ogawa et al. | .............. | 250/208.1 |
| 5,257,137 A * | 10/1993 | Suzuki et al. | ................ | 359/771 |
| 6,040,591 A * | 3/2000 | Otsuka | ......................... | 257/232 |
| 6,307,243 B1 * | 10/2001 | Rhodes | ........................ | 257/432 |
| 6,744,109 B2 * | 6/2004 | Barton et al. | ................. | 257/436 |
| 6,940,140 B1 | 9/2005 | Ikeda et al. | | |
| 7,115,853 B2 * | 10/2006 | Jiang et al. | ................. | 250/208.1 |
| 2003/0156210 A1 * | 8/2003 | Wako et al. | ................... | 348/273 |
| 2004/0032523 A1 * | 2/2004 | Hartlove et al. | ............. | 348/340 |
| 2005/0041134 A1 * | 2/2005 | Takayama | .................... | 348/340 |

FOREIGN PATENT DOCUMENTS

| | | |
|---|---|---|
| JP | 56-116649 | 9/1981 |
| JP | 62-67863 | 3/1987 |
| JP | 62-69674 | 3/1987 |
| JP | 62-132352 | 6/1987 |
| JP | 62-273768 | 11/1987 |
| JP | 4-157759 | 5/1992 |

(Continued)

OTHER PUBLICATIONS

Korean Office Action dated Aug. 4, 2006 (mailing date), issued in corresponding Korean Patent Application No. 10-2004-0086171.

(Continued)

*Primary Examiner* — Aung S Moe
*Assistant Examiner* — Mekonnen Dagnew
(74) *Attorney, Agent, or Firm* — Fujitsu Patent Center

(57) ABSTRACT

An image pickup device is disclosed that has little deformation caused by thermal expansion of a transparent resin for sealing an image pickup element. The image pickup device includes an image pickup element having a light receiving surface, a micro-lens for condensing incident light to the image pickup element, a first transparent plate disposed on the light receiving surface of the image pickup element with the micro-lens in between, a transparent resin that seals the image pickup element and the first transparent plate, and a second transparent plate disposed on the transparent resin to face the first transparent plate.

11 Claims, 21 Drawing Sheets

FOREIGN PATENT DOCUMENTS

| | | | |
|---|---|---|---|
| JP | 5-13738 | | 1/1993 |
| JP | 5-41506 | | 2/1993 |
| JP | 05041506 A | * | 2/1993 |
| JP | 5-90549 | | 4/1993 |
| JP | 7-38072 | | 2/1995 |
| JP | 10-321826 | | 12/1998 |
| JP | 10321826 A | * | 12/1998 |
| JP | 2000162408 A | * | 6/2000 |
| KR | 2001-40113 | | 5/2001 |

OTHER PUBLICATIONS

Japanese Office Action issued on Apr. 27, 2010 for Japanese Patent Application No. 2004-177598. An English-language translation is provided.

* cited by examiner

13a MICRO-LENS

22

IMAGE PICKUP DEVICE AND PRODUCTION METHOD THEREOF

CROSS-REFERENCE TO RELATED APPLICATION

This patent application is based on Japanese Priority Patent Application No. 2004-177598 filed on Jun. 15, 2004, the entire contents of which are hereby incorporated by reference.

BACKGROUND OF THE INVENTION

1. Field of the Invention

The present invention relates to an image pickup device and a method of producing the image pickup device, and particularly, to an image pickup device that has a light receiving element with a transparent plate provided on the light receiving surface thereof, and a method of producing such an image pickup device.

2. Description of the Related Art

Japanese Laid-Open Patent Application No. 62-67863 (for example, page 4 and FIG. 2) (below, referred to as "reference 1"), Japanese Laid-Open Patent Application No. 5-13738 (for example, pages 2, 3, and FIG. 1) (below, referred to as "reference 2"), and Japanese Laid-Open Patent Application No. 5-41506 (for example, page 3, and FIG. 3) (below, referred to as "reference 3") disclose image pickup devices using a CCD or CMOS imaging sensor as an image pickup element (or, a light receiving element), in which the image pickup element is accommodated in a package, and a transparent glass plate is placed on the image pickup element to allow light outside to enter into the image pickup element through the glass plate.

In reference 1, a semiconductor substrate 21 is installed on a lead line 26, and an electrode of the semiconductor substrate 21 is connected to the lead line 26 through a bonding wire 25; a glass plate 22 is placed on the upper surface of the semiconductor substrate 21 (light receiving surface), and the semiconductor substrate 21, the lead line 26, the electrode of the semiconductor substrate 21, the bonding wire 25, and others are sealed by using a resin 23, which includes black pigment and functions as a light absorbing material, so that the surface of the glass plate 22 is exposed.

In reference 1, the sealing resin 23 is applied surrounding the glass plate 22 to seal the package. In the course of the sealing process, however, the sealing resin 23 may extend to the surface of the glass plate 22, that is, the light receiving surface, and may hinder entrance of light onto the semiconductor substrate 21, thereby resulting in reduction of the amount of light received by the light receiving element.

In reference 1, another embodiment is disclosed in which another glass plate 27 is arranged on the glass plate 22. In this structure, the glass plate 27 is situated on both of the glass plate 22 and the resin 23 and is bonded with the glass plate 22. In this structure, however, similar to the former embodiment, the resin 23 also flows to the surface of the glass plate 22, and this hinders entrance of light onto the semiconductor substrate 21, and results in reduction of the amount of light received by the light receiving element.

In reference 2, an on-chip lens 3 and a transparent glass plate 7 are provided on a solid image pickup element 2, with a space 9 between the transparent glass plate 7 and the on-chip lens 3, and a transparent resin 8 is applied to cover the transparent glass plate 7.

In this structure, because the transparent glass plate 7 is covered by the transparent resin 8, light absorption can hardly occur in the transparent resin 8. However, because the surface of the resin 8 is not even, but has fine depressions and projections thereon, the incident light is scattered and reflected, resulting in loss of the incident light.

In order to improve the flatness of the surface of the transparent resin 8 formed by molding, usually, it may be attempted to improve smoothness of the mold for molding the transparent resin 8 (in other words, to reduce roughness of the mold), or to grind the surface of the transparent resin 8 after molding. Due to these treatments, however, the cost of fabrication rises.

In reference 3, a micro-lens 4 and a glass plate 7 are provided on a solid image pickup element 1, with a transparent resin 5 between the glass plate 7 and the micro-lens 4, and a transparent resin 6 is applied to cover the glass plate 7.

In this structure, because the glass plate 7 is covered by the transparent resin 6, even when the resin 6 is extended, it does not hinder entrance of light into the light receiving element.

In order for the transparent resin to have a high light transmission characteristic, it is required that glass fibers or carbon granules or other fillers not be added in the transparent resin. Due to this, however, the thermal expansion coefficient of the transparent resin increases, and as a result, when sealing the package, or when the package is heated during mounting the package to an electronic device, the transparent resin may deform. Because of the deformation of the transparent resin, the semiconductor device also deforms, for example, the device bends, and this imposes large stresses on the glass plate 7, the micro-lens 4, and the solid image pickup element 1, thereby degrading the performance of the image pickup device.

Summarizing the problems to be solved, in the technique disclosed by reference 1, the sealing resin 23 is applied surrounding the glass plate 22 for sealing, but in the course of sealing, the sealing resin 23 may extend to the surface of the glass plate 22, which is the light receiving portion, and may hinder entrance of light onto the semiconductor substrate 21 and result in reduction of the amount of light received by the light receiving element.

Even when the additional glass plate 27 is arranged on the glass plate 22, as disclosed in another embodiment in reference 1, in which the glass plate 27 is situated on both of the glass plate 22 and the resin 23 and is bonded with the glass plate 22, the problems remain in that the resin 23 flows to the surface of the glass plate 22, hinders entrance of light onto the semiconductor substrate 21, and results in reduction of the amount of light received by the light receiving element.

In the technique disclosed in reference 2, because the transparent glass plate 7 is covered by the transparent resin 8, light absorption can hardly occur in the transparent resin 8, but because of the fine unevenness of the surface of the resin 8, the incident light is scattered and reflected, resulting in loss of the incident light.

In the technique disclosed in reference 3, in order for the transparent resin to have a high light transmission characteristic, it is required that glass fibers or carbon granules or other fillers not be added in the transparent resin. For this reason, the thermal expansion coefficient of the resin increases, and when sealing the package, or when the package is heated during mounting the package to an electronic device, the transparent resin may deform; this deformation may further induce deformation of the semiconductor device (for example, bending of the device), and further imposes large stresses on the glass plate 7, the micro-lens 4, and the solid image pickup element 1, thereby degrading the performance of the image pickup device.

SUMMARY OF THE INVENTION

It is a general object of the present invention to solve one or more of the problems of the related art.

It is a more specific object of the present invention to provide an image pickup device that uses a transparent resin to ensure high performance of light entrance, has little deformation caused by thermal expansion of the transparent resin, and thus has high performance of image pickup.

According to a first aspect of the present invention, there is provided an image pickup device including an image pickup element having a light receiving surface; a first transparent plate disposed on the light receiving surface of the image pickup element; a transparent resin that seals the image pickup element and the first transparent plate; and a second transparent plate disposed on the transparent resin to face the first transparent plate.

As an embodiment, the area of the second transparent plate is greater than the area of the first transparent plate.

As an embodiment, the first transparent plate is disposed with an air layer between the first transparent plate and the image pickup element.

As an embodiment, a light transmitting adhesive material is disposed between the first transparent plate and the image pickup element.

As an embodiment, the first transparent plate is in contact with a lens formed on the light receiving surface of the image pickup element.

As an embodiment, the second transparent plate is in contact with the first transparent plate.

According to the present invention, because the second transparent plate functions as a reinforcement member, the image pickup device does not deform.

According to a second aspect of the present invention, there is provided an image pickup device including an image pickup element having a light receiving surface; a transparent plate disposed on the light receiving surface of the image pickup element; and a transparent resin that seals the image pickup element and the transparent plate. The transparent plate is in contact with a lens formed on the light receiving surface of the image pickup element.

As an embodiment, the transparent plate is fixed on the image pickup element by using an adhesive material; and a groove is formed in at least one of the transparent plate and a region on the image pickup element where the adhesive material is applied.

As an embodiment, the transparent plate is fixed on the image pickup element by using an adhesive material; and a hydrophobic member is disposed on at least one of the transparent plate and a region on the image pickup element where the adhesive material is applied.

According to a third aspect of the present invention, there is provided a method of producing an image pickup device. The method includes the steps of disposing an image pickup element on a substrate; disposing a first transparent plate on the image pickup element; connecting the image pickup element with an electrode arranged on the substrate; arranging a second transparent plate in a mold and arranging the substrate on which the image pickup element and the first transparent plate are disposed so that the first transparent plate faces the second transparent plate; and sealing surroundings of the image pickup element and the first transparent plate with a transparent resin.

These and other objects, features, and advantages of the present invention will become more apparent from the following detailed description of the preferred embodiments given with reference to the accompanying drawings.

DESCRIPTION OF THE PREFERRED EMBODIMENTS

Below, preferred embodiments of the present invention are explained with reference to the accompanying drawings.

First Embodiment

Figure 1:
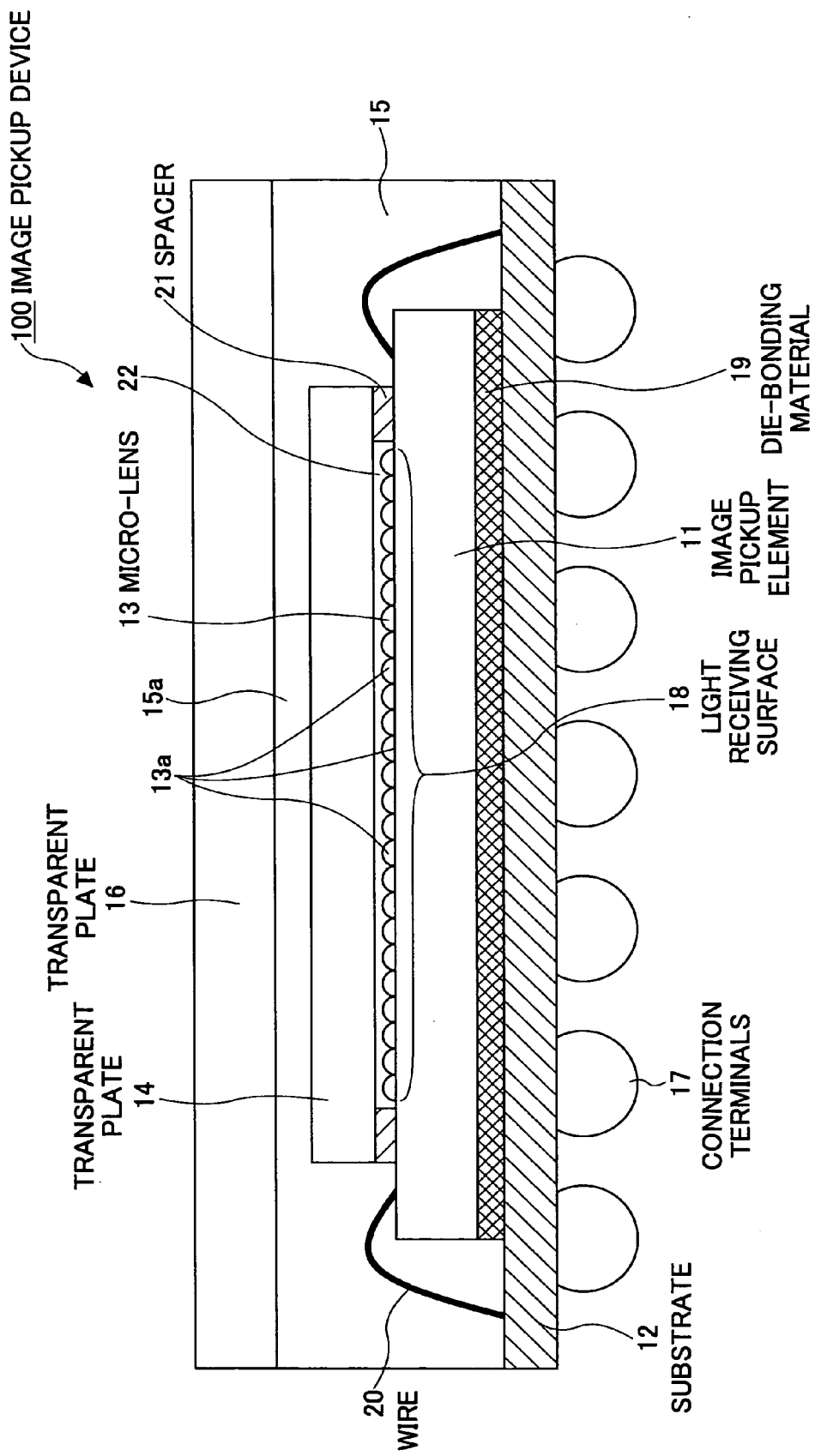
FIG. 1 is a cross-sectional view of an image pickup device according to a first embodiment of the present invention.

FIG. 1 is a cross-sectional view of an image pickup device 100 according to a first embodiment of the present invention.

As illustrated in FIG. 1, the image pickup device 100 includes an image pickup element (light receiving element) 11, a substrate 12, a micro-lens 13, a first transparent plate 14, transparent resin 15, a second transparent plate 16, and external connection terminals 17.

The upper surface of the image pickup element 11 is the light receiving surface 18, and the image pickup element 11 is mounted and fixed on the substrate 12 through a Die-bonding material 19. Although not illustrated in FIG. 1, a number of photo diodes are arranged in a matrix manner on the light receiving surface 18 of the image pickup element 11, and the micro-lens 13 is arranged on the photo diodes via a not-illustrated color filter layer.

For example, the color filter layer is formed from a photo resist (a photo sensitive resin) added with a certain pigment, and is segmented corresponding to the photo diodes. Each of the segments is colored to be Red, Green, or Blue, that is, the three primary colors, and the colored segments are arranged in order.

The micro-lens 13, for example, is formed from a positive photo-resist, on which an aggregation of a number of nearly hemispherical lenses 13a is formed, while being in correspondence with the photo diodes, by photo etching and re-flowing, or by transfer. Each individual lens 13a condenses the incident light to a light receiving portion of a corresponding photo diode.

The substrate 12, for example, is a multi-layer circuit board formed from a glass epoxy-based resin, and circuits and via-holes (not illustrated) for interlayer connection are formed on the surface or inside the substrate 12. On the surface of the substrate 12, on which the image pickup element 11 is disposed, bonding pads (not illustrated) are arranged for wire connections, and on the opposite surface of the substrate 12, lands (not-illustrated) are arranged. The substrate 12 is also referred to as an "interposer".

Electrodes of the image pickup element 11 are electrically connected with the bonding pads on the upper surface of the substrate 12 via gold wires 20. On the lands on the lower surface of the substrate 12, the external connection terminals 17, for example, solder balls, are formed. In other words, the electrodes of the image pickup element 11 are electrically connected with the external connection terminals 17 through the wires 20, the circuits and the inter-connection via-holes formed in the substrate 12.

The first transparent plate 14, for example, formed from a transparent glass, is disposed on the light receiving surface 18 of the image pickup element 11 with a spacer 21 in between, and further, the transparent resin 15 is applied to cover the first transparent plate 14.

In the present embodiment, the second transparent plate 16 is further disposed on the transparent resin 15 to face the first transparent plate 14, and the area of the second transparent plate 16 is greater than that of the first transparent plate 14. For example, the second transparent plate 16 is also formed from a transparent glass. The second transparent plate 16 is fixed on the transparent resin 15.

In the image pickup device 100 according to the present embodiment, as described above, on the light receiving surface 18 of the image pickup element 11, the first transparent plate 14 formed from a transparent glass, the transparent resin 15, and the second transparent plate 16 formed from a transparent glass, are disposed on the micro-lens 13.

Here, by the terminology "transparent", it means that a material is transparent relative to the light received by the image pickup element 11, that is, if the image pickup element 11 works in the visible light wavelength region, the terminology "transparent" means that a material is transparent relative to visible light.

In the image pickup device 100 according to the present embodiment, the first transparent plate 14 is disposed on the image pickup element 11 via the spacer 21, there is a space 22 between the first transparent plate 14 and the micro-lens 13, and air exists in the space 22.

The light-condensing ability of the micro-lens 13 is determined by the difference between the refractive indexes of the micro-lens 13 and the material on the incident side of the micro-lens 13 along the light path. Here, the material on the incident side of the micro-lens 13 is the air in the space 22.

For example, typically, the refractive index of the micro-lens 13 is about 1.55, and the refractive index of air is 1. It is clear when air exists surrounding the micro-lens 13 (that is, when air exists between the micro-lens 13 and the first transparent plate 14), the micro-lens 13 can obtain its highest light-condensing ability.

The outer surface of the first transparent plate 14 is sealed in the transparent resin 15, that is, the transparent resin 15a exists above the first transparent plate 14.

By sealing the first transparent plate 14 in the transparent resin 15, the first transparent plate 14 is reliably supported, thereby preventing position shift of the first transparent plate 14. Further, because the transparent resin 15a having uniform thickness exists on the first transparent plate 14, it is possible to improve performance of light entrance to the image pickup element 11.

The transparent resin 15, into which the first transparent plate 14 is sealed, is formed, for example, by molding resin, and protects the image pickup element 11 and the wire 20.

Here, as it is required that the transparent resin 15 be of high light-transmission capability, that is, of high transparency, a resin without any additions of glass fibers, or carbon granules, or other fillers is used as the transparent resin 15. As a result, as described above, the transparent resin 15 has a large thermal expansion coefficient, and expands or contracts when being heated or cooled.

In addition, in order to prevent a bonding capillary from contacting the first transparent plate 14 when connecting electrodes of the image pickup element 11 with the bonding pads on the upper surface of the substrate 12 via the wires 20, it is set that the area of the first transparent plate 14 is less than that of the image pickup element 11. Therefore, when the transparent resin 15 or the substrate 112 expands or contracts when being heated or cooled, it is difficult to absorb the expansion or contraction only by the first transparent plate 14.

Typical linear expansion coefficients of the elements in the image pickup device 100 are as follows.
transparent resin 15: $50\text{-}150 \times 10^{-6}$ (1/° C.),
transparent plate 14 (glass): $50\text{-}150 \times 10^{-6}$ (1/° C.)
substrate 12 (glass epoxy resin):
　　$10\text{-}20 \times 10^{-6}$ (1/° C.) in the XY directions
　　$100\text{-}250 \times 10^{-6}$ (1/° C.) in the Z direction In the image pickup device 100 according to the present embodiment, as described above, the second transparent plate 16 is disposed on the transparent resin 15, which covers the first transparent plate 14. Because the second transparent plate 16 can be disposed regardless of the wire bonding process, it is possible to dispose the second transparent plate 16 having an area greater than that of the first transparent plate 14, in other words, having an area the same as that of the substrate 12.

In addition, because the second transparent plate 16 is formed from glass, it has a thermal expansion coefficient smaller than those of the substrate 12 or the transparent resin 15, so the thickness of the second transparent plate 16 can be specified arbitrarily, and thus, a desired strength can be obtained easily. Therefore, when the substrate 12 or the transparent resin 15 is to expand due to heating, the thermal expansion is limited by the second transparent plate 16. Consequently, it is possible to prevent bending of the image pickup device 100 caused by the thermal expansion of the substrate 12 or the transparent resin 15, and to improve reliability of the image pickup device 100.

The strength of the second transparent plate 16 can be adjusted by changing its thickness. Specifically, an optimum thickness of the second transparent plate 16 can be appropriately determined according to the thermal expansion coefficient of the substrate 12 or the transparent resin 15 used in the image pickup device 100. Thereby, it is possible to improve the reliability of the image pickup device 100, and at the same time, to prevent an increase of the size of the image pickup device 100.

In the present embodiment, the outmost light receiving area of the image pickup device 100 is constituted by the second transparent plate 16. Because the second transparent plate 16 can have a flat surface, scattering and reflection of the incident light can hardly occur, thereby resulting in high performance of light entrance (that is, high light reception efficiency).

Depending on practical applications, an AR (anti-reflection) coating layer or an IR (Infrared Radiation) resisting coating layer may be formed on the surface of the first transparent plate 14, and on the surface of the second transparent plate 16.

In the present embodiment, the sealing resin 15a (that is the "transparent molded resin") exists between the first transparent plate 14 and the second transparent plate 16. In this case, when depressions and projections exist on the contacting surfaces of the sealing resin 15a and the second transparent plate 16, if the refractive indexes of the sealing resin 15a and the second transparent plate 16 are different, these depressions and projections act as lenses and degrade the optical characteristics. Therefore, in the present embodiment, it is preferable to select materials of the second transparent plate 16 and the sealing resin 15a so that the refractive index of the sealing resin 15a is approximately equal to the refractive index of the second transparent plate 16.

It is described that the second transparent plate 16 is formed from glass, but the second transparent plate 16 is not limited to this material. The second transparent plate 16 may also be formed by other materials of high transparency (that is, high light transmission ability), small thermal expansion coefficient, and a sufficiently high strength. For example, the second transparent plate 16 may be formed of resins satisfying these conditions.

Second Embodiment

Figure 2:
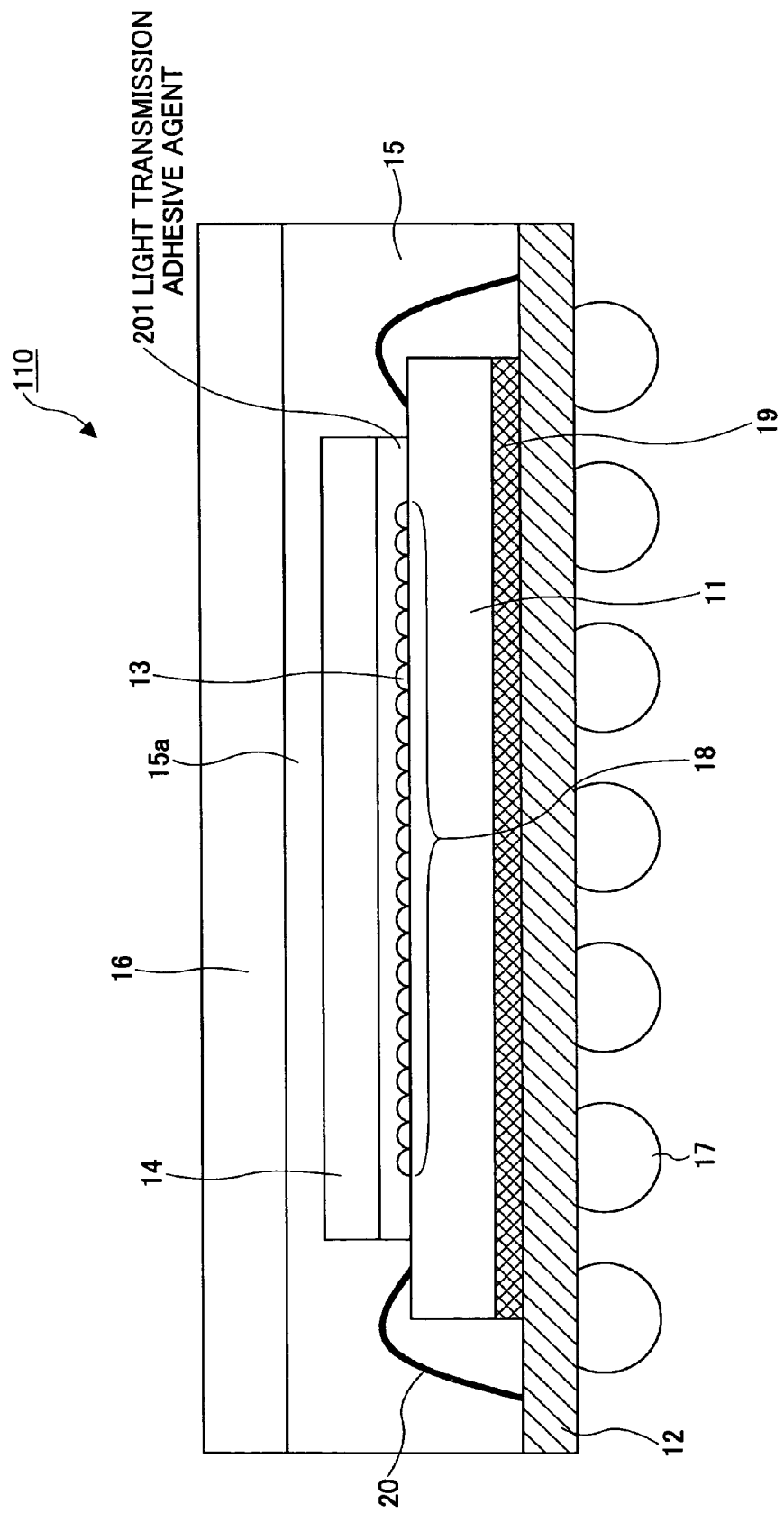
FIG. 2 is a cross-sectional view of an image pickup device according to a second embodiment of the present invention.

FIG. 2 is a cross-sectional view of an image pickup device 110 according to a second embodiment of the present invention.

In the following descriptions and drawings in the present embodiment, and in the subsequent embodiments, the same reference numbers are used for the same elements as those in the first embodiment and FIG. 1, and duplicate descriptions are omitted.

As illustrated in FIG. 2, the image pickup device 110 is basically the same as the image pickup device 100 except that in the image pickup device 110 of the present embodiment, a light transmission adhesive agent 201 is disposed between the first transparent plate 14 and the image pickup element 11, instead of the air layer 22 in the first embodiment.

In order to improve light condensing performance, the light transmission adhesive agent 201 is formed from a material having a smaller refractive index than that of the micro-lens 13.

According to the present embodiment, because there are no voids in the transparent resin 15, the image pickup device 110 is a solid stack of resin and glass materials, which increases the strength of the image pickup device 110 against external forces applied from the upper side.

Third Embodiment

Figure 3:
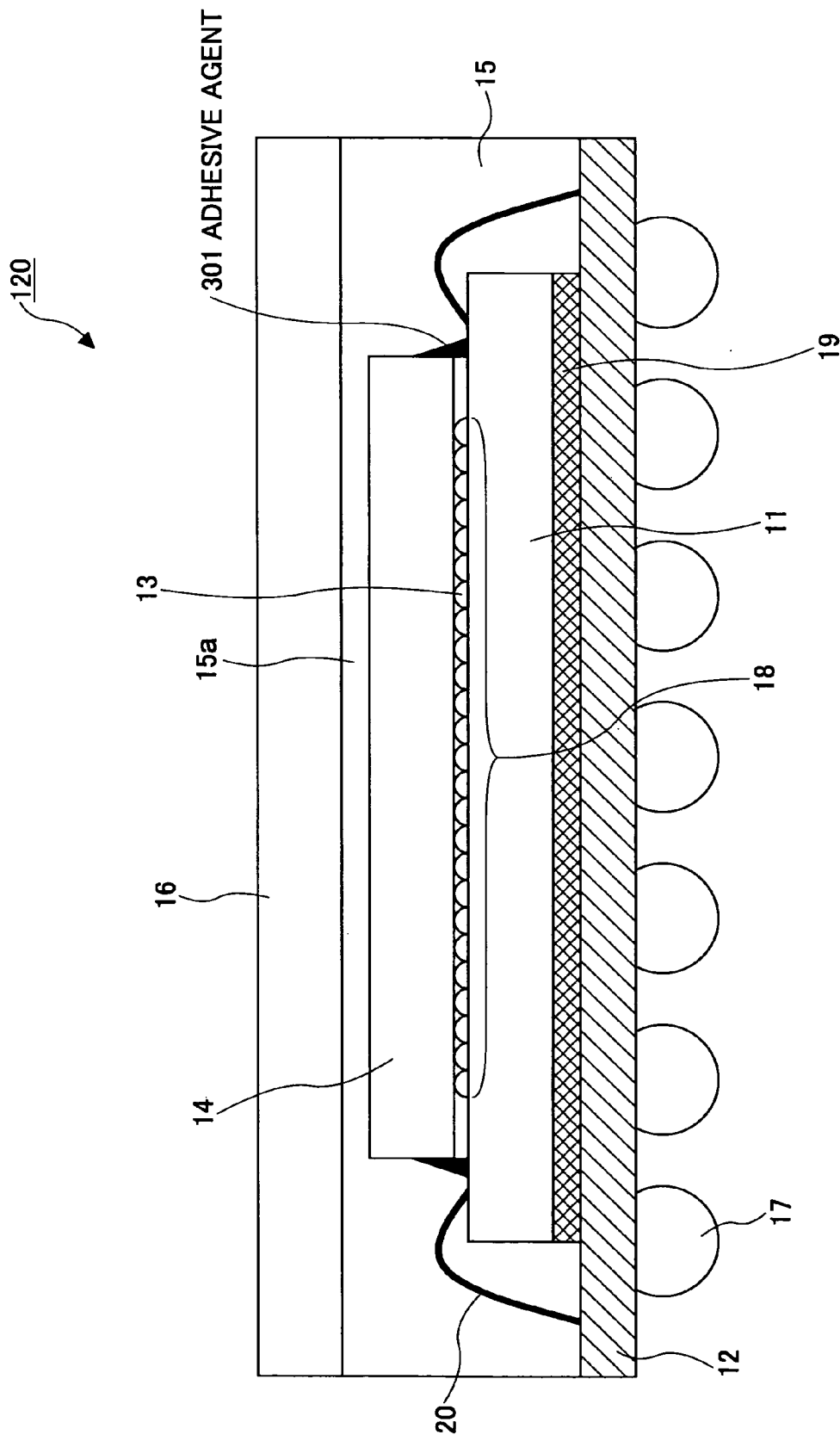
FIG. 3 is a cross-sectional view of an image pickup device according to a third embodiment of the present invention.

FIG. 3 is a cross-sectional view of an image pickup device 120 according to a third embodiment of the present invention.

As illustrated in FIG. 3, in the image pickup device 120, the first transparent plate 14 is directly disposed on the micro-lens 13.

The first transparent plate 14 is fixed on the image pickup element 11 by an adhesive agent 301. Because there are spaces surrounding individual lenses 13a of the micro-lens 13, air may be introduced into the spaces.

According to the present embodiment, it is possible to obtain good optical characteristics compared with a structure in which a transparent resin is placed between the first transparent plate 14 and the micro-lens 13. In addition, because the first transparent plate 14 is directly supported by the micro-lens 13, the image pickup device 120 has increased strength against external forces applied from the upper side.

For convenience, effects of disposing the first transparent plate 14 directly on the micro-lens 13 are described below in the eighth embodiment of the present invention.

Fourth Embodiment

Figure 4:
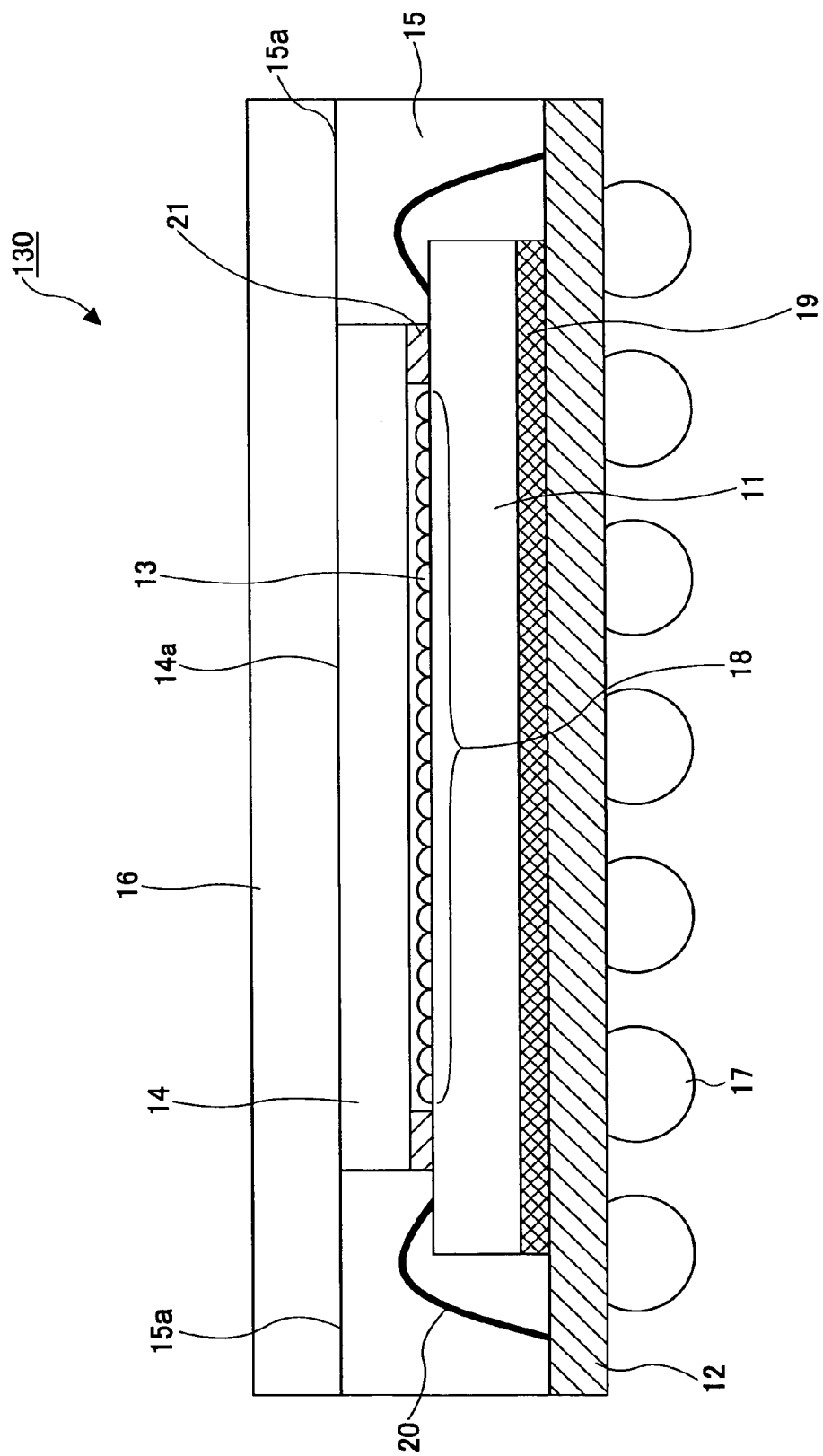
FIG. 4 is a cross-sectional view of an image pickup device according to a fourth embodiment of the present invention.

FIG. 4 is a cross-sectional view of an image pickup device 130 according to a fourth embodiment of the present invention.

As illustrated in FIG. 4, in the image pickup device 130, the upper surface 14a of the first transparent plate 14 is exposed relative to the transparent resin 15, and the upper surface 14a of the first transparent plate 14 and the upper surface 15a of the transparent resin 15 are in the same plane. Due to this structure, the second transparent plate 16 is disposed while contacting both the upper surface 14a of the first transparent plate 14 and the upper surface 15a of the transparent resin 15.

According to the present embodiment, because the air or resins are not imposed between the second transparent plate and the first transparent plate 14, refraction of the incident light does not occur, thus it is possible to obtain sufficiently high optical characteristics.

Fifth Embodiment

Figure 5:
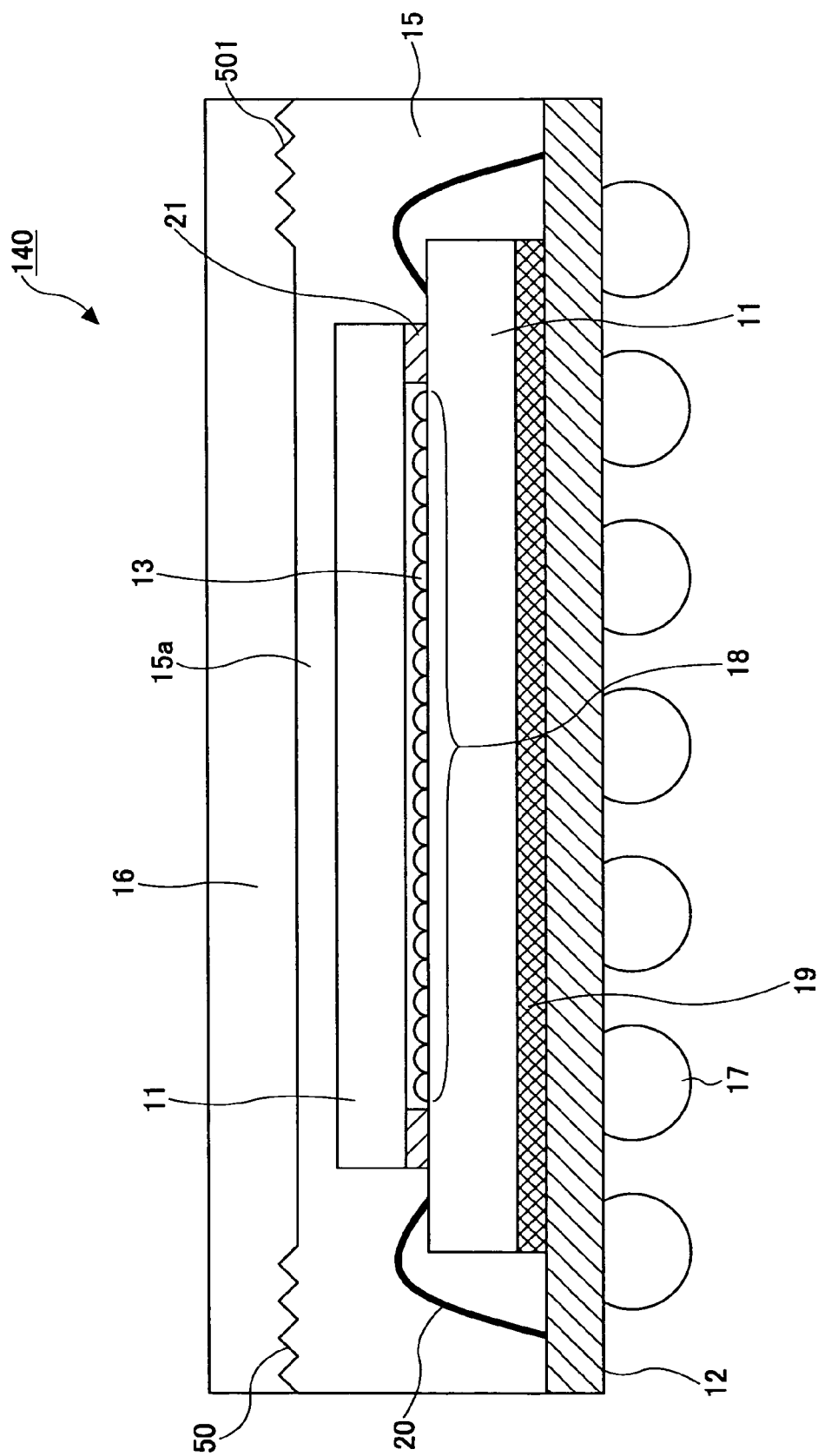
FIG. 5 is a cross-sectional view of an image pickup device according to a fifth embodiment of the present invention.

FIG. 5 is a cross-sectional view of an image pickup device 140 according to a fifth embodiment of the present invention.

As illustrated in FIG. 5, in the image pickup device 140, in part of contacting regions between the second transparent plate 16 and the transparent resin 15, unevenness regions 501 including depressions and projections are formed so as to increase the contacting area between the second transparent plate 16 and the transparent resin 15. The locations and areas of the unevenness regions 501 are appropriately determined so that the light receiving area of the image pickup element 11 is not occupied.

Generally, in a common image pickup device, the second transparent plate 16 and the transparent resin 15 have different thermal expansion coefficients. For this reason, the contacting surface between the second transparent plate 16 and the transparent resin 15 is subjected to stress caused by the difference of the thermal expansion coefficients when being heated or cooled. Because this stress acts on the contacting surface between the second transparent plate 16 and the transparent resin 15 in a shearing direction, if the contacting surface between the second transparent plate 16 and the transparent resin 15 is a flat surface, the second transparent plate 16 may be separated from the transparent resin 15.

However, in the present embodiment, because the unevenness regions 501 including depressions and projections are formed in part of the contacting regions between the second transparent plate 16 and the transparent resin 15, the adhesive strength between the second transparent plate 16 and the transparent resin 15 increases; therefore, in spite of the stress acting on the contacting surface between the second transparent plate 16 and the transparent resin 15 in a shearing direction, the second transparent plate 16 cannot be separated from the transparent resin 15. Therefore, the image pickup device 140 of the present embodiment has high reliability.

Sixth Embodiment

Figure 6:
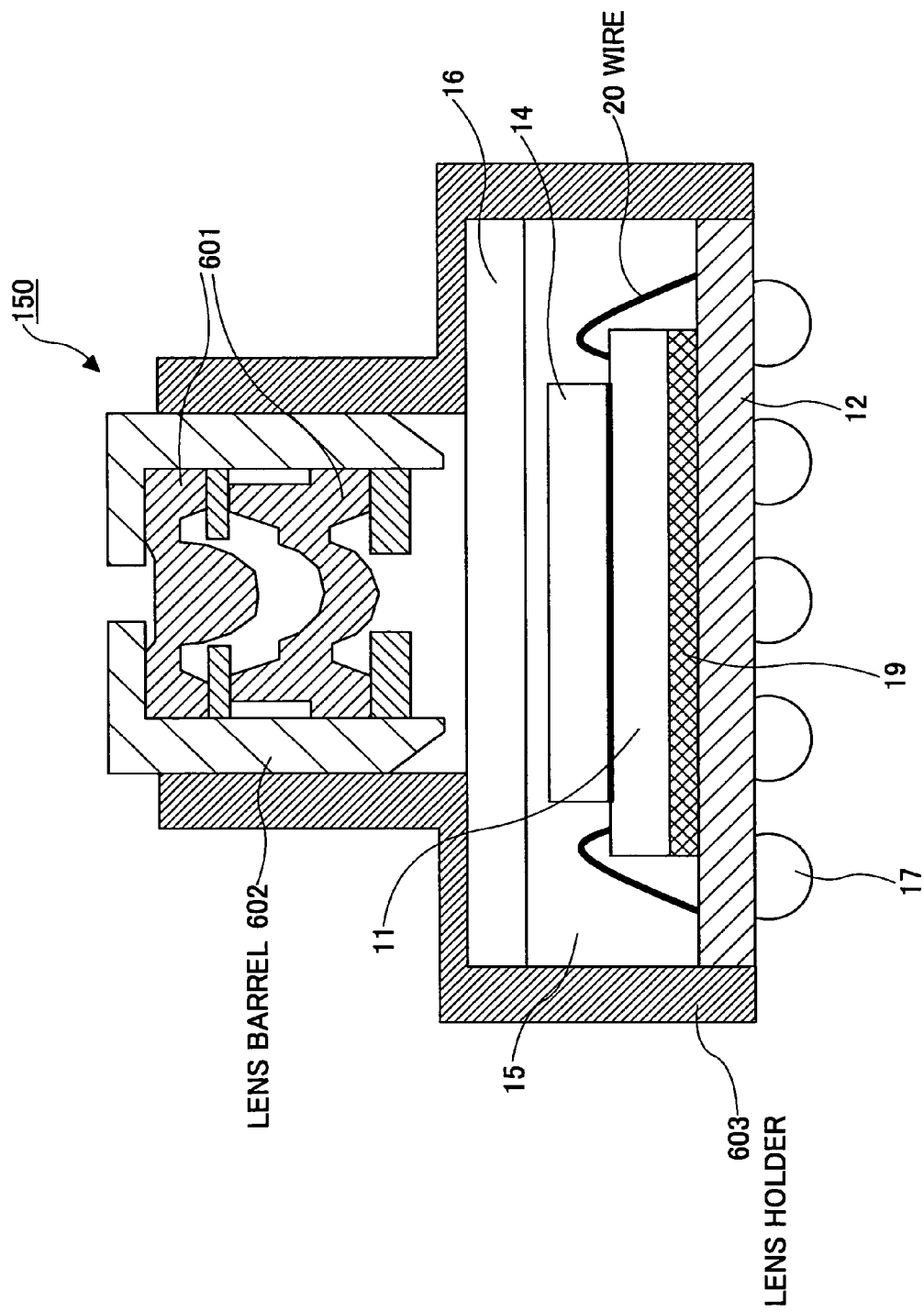
FIG. 6 is a cross-sectional view of an image pickup device according to a sixth embodiment of the present invention.

FIG. 6 is a cross-sectional view of an image pickup device 150 according to a sixth embodiment of the present invention.

As illustrated in FIG. 6, in the image pickup device 150, a lens barrel 602 accommodating lenses 601 is mounted on the second transparent plate 16. The lens barrel 602 is attached to the main body of the image pickup device 150, including the second transparent plate 16, by using a lens holder 603.

For example, the lens holder 603 is formed from a resin with light-shielding fillers added so that only the incident light passing through the lenses 601 is allowed to enter into the image pickup element 11; light that does not pass through the lenses 601 cannot arrive at the image pickup element 11. Hence, noise caused by light not passing through the lenses 601 is eliminated, and this prevents ghost or flare that causes degradation of the optical characteristics of the image pickup element 11.

In addition, by using the lens holder 603, in which the lens barrel 602 is installed, to shield external light, the cost of the image pickup device 150 does not increase.

Seventh Embodiment

In the present embodiment, a method of fabricating an image pickup device according to the present invention is described with reference to FIG. 7 through FIG. 13. Furthermore, the image pickup device 110 of the second embodiment is taken as an example in the following descriptions.

In the present embodiment, in order to fabricate a plurality of the image pickup devices 110 in one step, a large-size substrate 701 is used, which is equivalent to a plurality of the substrates 12, on each of which one image pickup device 110 is disposed and fixed.

Figure 7:
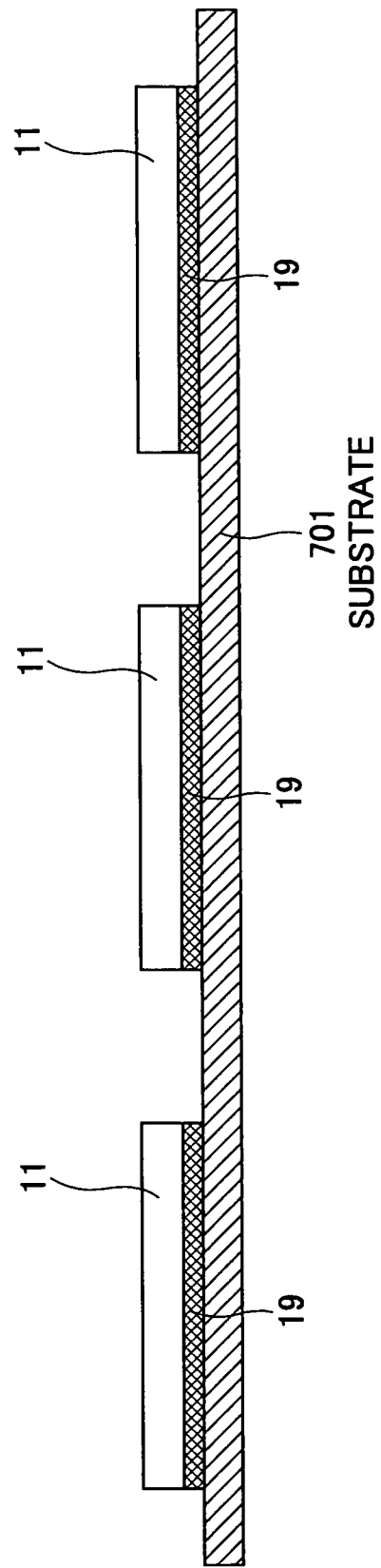
FIG. 7 is a cross-sectional view illustrating a method of producing an image pickup device according to a seventh embodiment of the present invention.

FIG. 7 is a cross-sectional view illustrating a method of producing an image pickup device according to the present invention.

As illustrated in FIG. 7, a number of the image pickup elements 11 (light receiving elements) are mounted and fixed on the multi-layer substrate 701 formed from a glass epoxy-based resin by the Die-bonding material 19. On the light receiving surface of each image pickup element 11, a color filter and a micro-lens (not illustrated) are disposed in advance.

Figure 8:
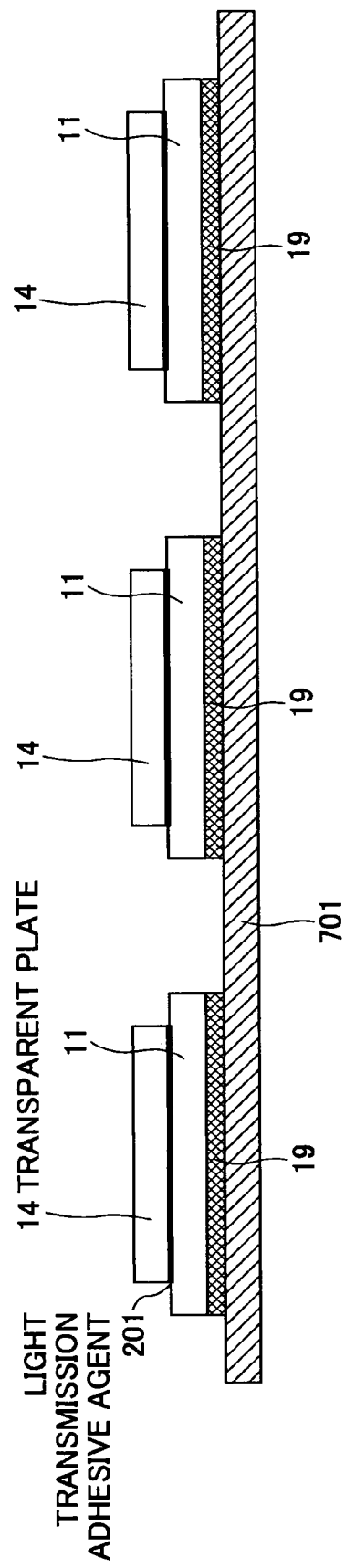
FIG. 8 is a cross-sectional view, continued from FIG. 7, illustrating the method of producing an image pickup device according to the present invention.

FIG. 8 is a cross-sectional view, continued from FIG. 7, illustrating the method of producing an image pickup device according to the present invention.

As illustrated in FIG. 8, the light transmission adhesive agent 201 is used to dispose and fix the first transparent plate 14 on the not-illustrated micro-lens of each image pickup element 11. Here, the first transparent plate 14, for example, is formed from glass, and the light transmission adhesive agent 201 is formed from a material having a smaller refractive index than that of the micro-lens. In addition, the first transparent plate 14 has an appropriate area so that the first transparent plate 14 is able to cover the light receiving area of the image pickup element 11 but does not contact bonding tools when connecting the electrodes of the image pickup element 11 with wires.

It should be noted that the step of die-bonding the image pickup element 11 on the substrate 12 may be carried out after the first transparent plate 14 is attached to the image pickup element 11. In order to prevent adhesion of foreign matter, which degrades optical characteristics, to the micro-lens on the image pickup element 11, it is preferable to cover the light receiving surface of the image pickup element 11 as early as possible.

Figure 9:
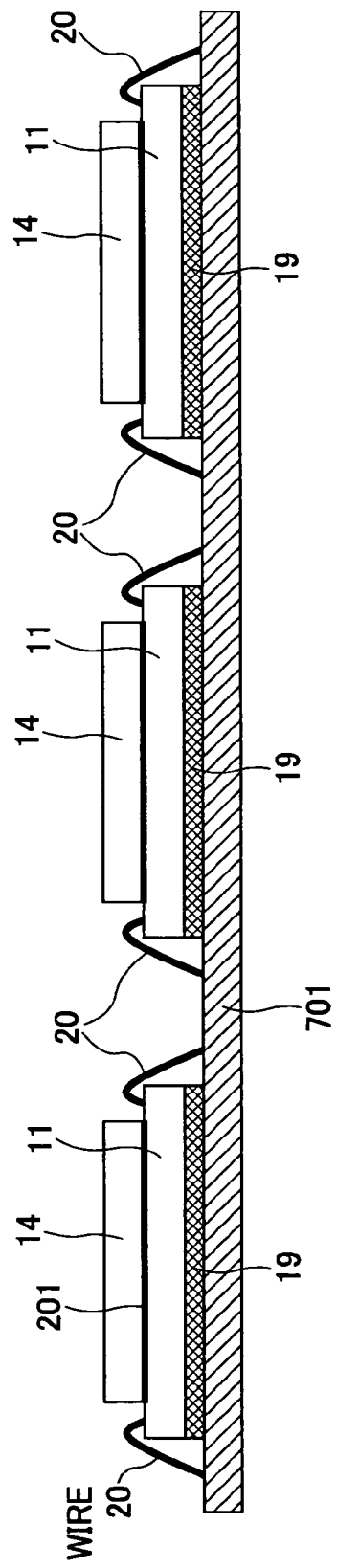
FIG. 9 is a cross-sectional view, continued from FIG. 8, illustrating the method of producing an image pickup device according to the present invention.

FIG. 9 is a cross-sectional view, continued from FIG. 8, illustrating the method of producing an image pickup device according to the present invention.

As illustrated in FIG. 9, after the image pickup element 11 with the first transparent plate 14 thereon is mounted on the substrate 12, the electrodes of the image pickup element 11 are electrically connected with the electrodes on the substrate 12 via the wires 20. After the wire-bonding step, the substrate 701 is placed in a mold for molding the transparent resin 15. In the present embodiment, compression molding is employed to mold the transparent resin 15.

Figure 10:
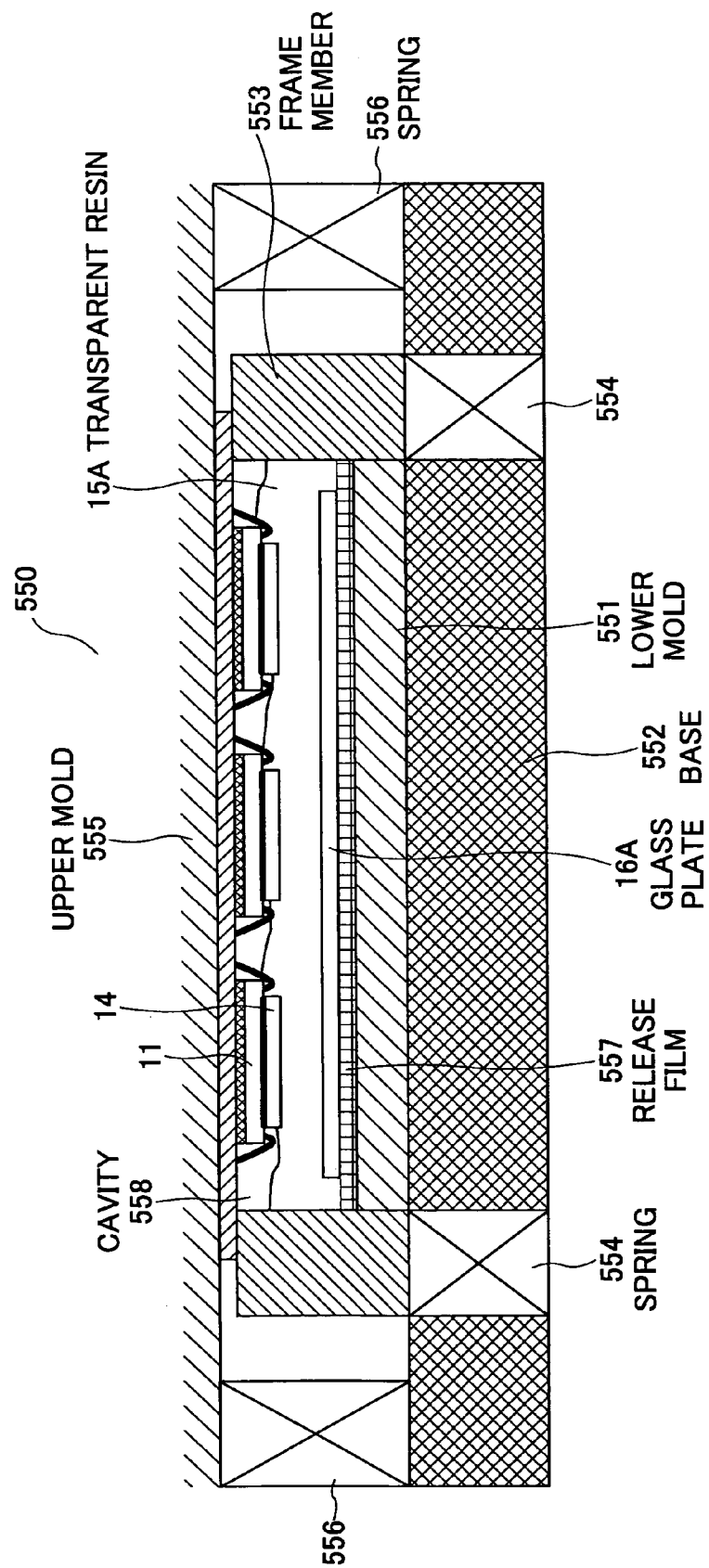
FIG. 10 is a cross-sectional view, continued from FIG. 9, illustrating the method of producing an image pickup device according to the present invention.

FIG. 10 is a cross-sectional view, continued from FIG. 9, illustrating the method of producing an image pickup device according to the present invention.

As illustrated in FIG. 10, the substrate 701 with the image pickup elements 11 in fabrication being mounted thereon is placed in a mold 550, which is used in the compression molding.

In the mold 550, a lower mold 551 is provided on a base 552, and a frame member 553 is arranged surrounding the lower mold 551. The frame member 553 is supported by a spring 554 so as to be movable up and down. An upper mold 555 is placed above the lower mold 551 and on the frame member 553, and is supported by a spring 556 so as to be movable up and down. For example, the springs 554 and 556 are electronically operated, and can be driven to expand and shrink by a not-illustrated control device.

In a molding process using the mold 550, a release film 557, for example, formed from PTFE (polytetrafluoroethylene), is disposed on the upper surface of the lower mold 551, and then a glass plate 16A is disposed on the release film 557 for forming the second transparent plate 16.

Next, a fused transparent resin 15A is put into a cavity 558 formed between the lower mold 551 and the frame member 553 to a specified depth.

A not-illustrated heater is attached to the base 552, whereby, the transparent resin 15A is kept in a fused state in the cavity 558.

The substrate 701 is held in advance in the upper mold 555 with the surface of the substrate 701 carrying the image pickup elements 11 facing downward, that is, with the first transparent plates 14 on the image pickup elements 11 facing the glass plates 16A.

Figure 11:
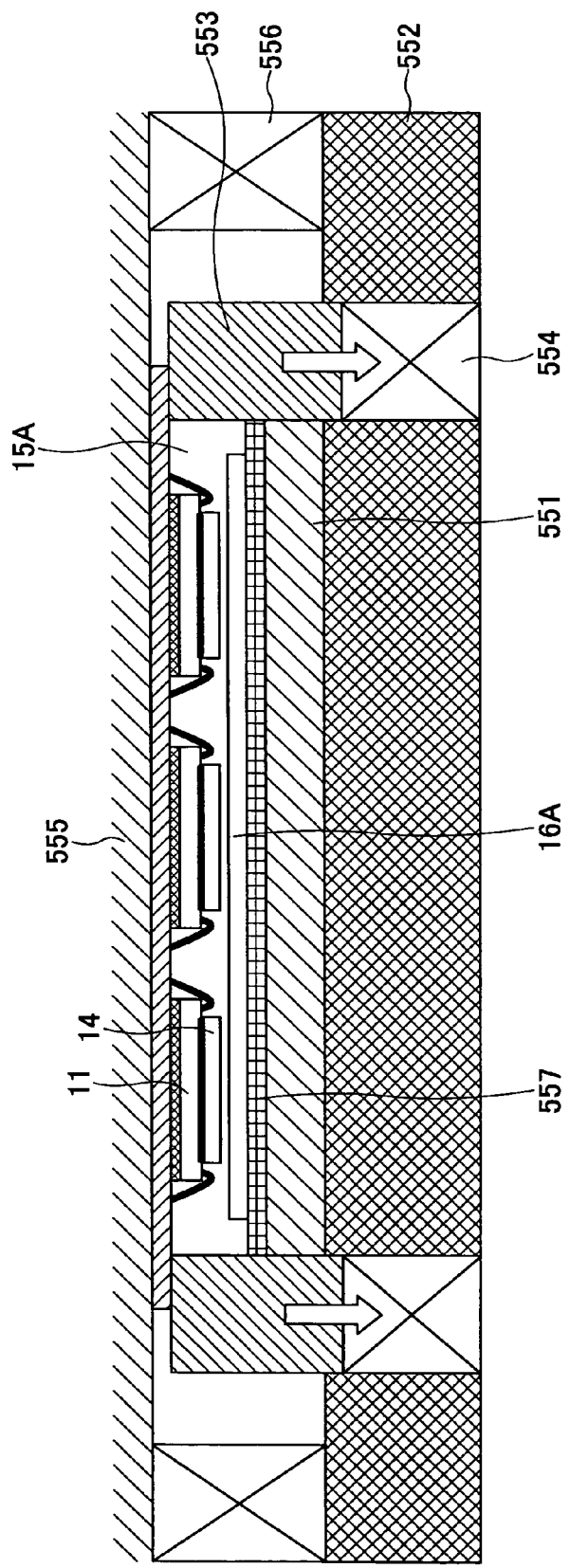
FIG. 11 is a cross-sectional view, continued from FIG. 10, illustrating the method of producing an image pickup device according to the present invention.

FIG. 11 is a cross-sectional view, continued from FIG. 10, illustrating the method of producing an image pickup device according to the present invention.

As illustrated in FIG. 11, the springs 554 and 556 are driven to move the upper mold 555 downward so that the image pickup element 11 carried by the substrate 701 immerse into the transparent resin 15A. Then, while heating the transparent resin 15A, the upper mold 555 is kept on being pressed so that vacancies do not occur in the cavity 558.

After the transparent resin 15A hardens, a molded resin cover, which constitutes the transparent resin 15, is formed. Then, the springs 554 and 556 are driven to move the frame member 553 downward, and the upper mold 555 upward.

Afterward, the substrate 701 is moved to separate the glass plate 16A, the transparent resin 15A from the release film 557. In this step, a structure is obtained in which the image pickup element 11 carried by the substrate 701 is covered by the transparent resin 15A, and the glass plate 16A is arranged on the transparent resin 15A.

Figure 12:
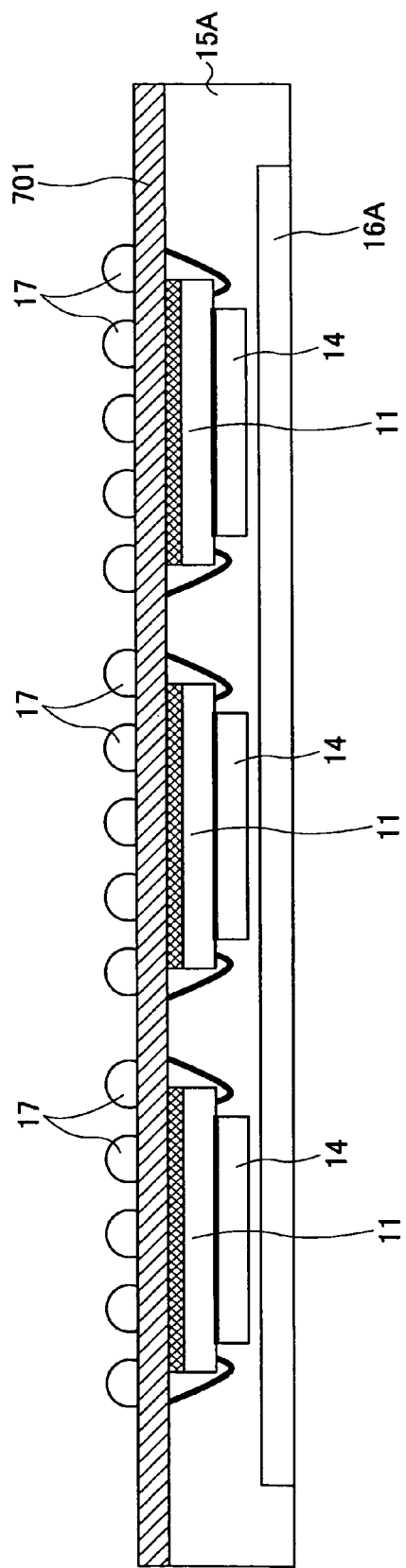
FIG. 12 is a cross-sectional view, continued from FIG. 11, illustrating the method of producing an image pickup device according to the present invention.

FIG. 12 is a cross-sectional view, continued from FIG. 11, illustrating the method of producing an image pickup device according to the present invention.

As illustrated in FIG. 12, the external connection terminals 17, for example, solder balls, are formed on the electrode pads on the back surface of the substrate 701.

Figure 13:
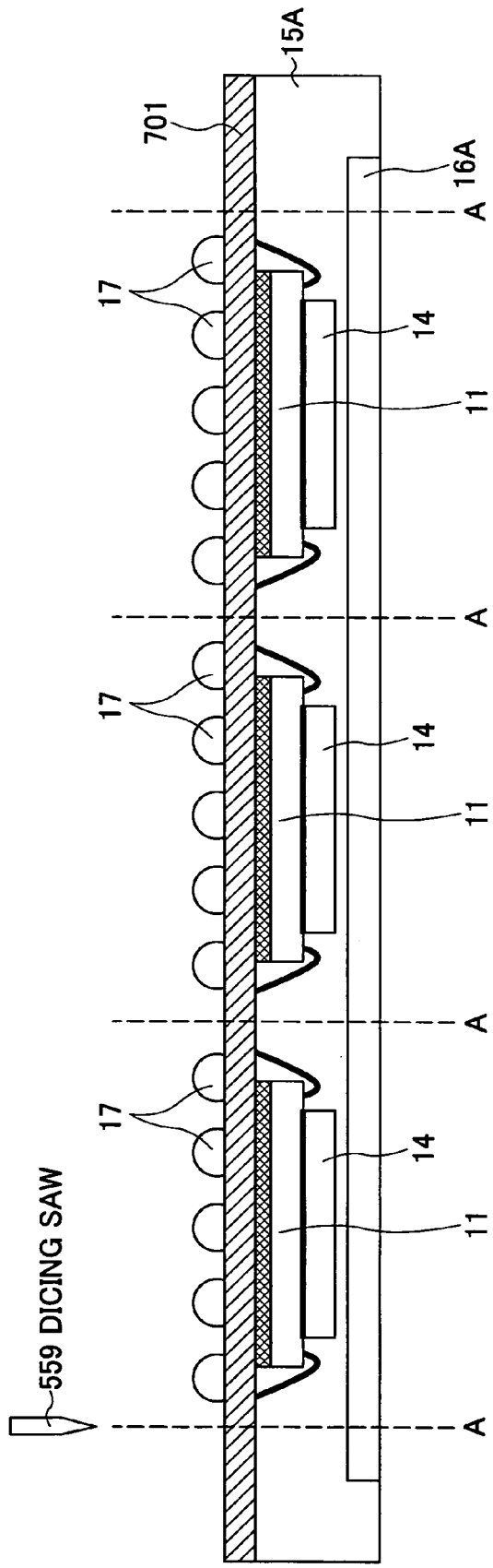
FIG. 13 is a cross-sectional view, continued from FIG. 12, illustrating the method of producing an image pickup device according to the present invention.

FIG. 13 is a cross-sectional view, continued from FIG. 12, illustrating the method of producing an image pickup device according to the present invention.

As illustrated in FIG. 13, a dicing saw 559 is used to cut the stacked layer structure of the substrate 701, the transparent 15A and the glass plate 16A along the dicing lines A into a plurality of image pickup devices 110, as illustrated in FIG. 2.

According to the method of fabricating an image pickup device of the present invention, the glass plate 16A, which constitutes the second transparent plate 16, is disposed in the mold 550 in advance, then the transparent resin 15A for sealing is introduced, and the substrate 701, on which the image pickup elements 11 and the first transparent plates 14 are disposed, is put into the mold 550 to seal the image pickup elements 11 and the first transparent plates 14 with the transparent resin 15A.

In the present embodiment, sealing of the image pickup elements 11 and the first transparent plates 14 is carried out at the same time as mounting of the glass plate 16A, which becomes the second transparent plate 16; therefore, the efficiency of fabrication is high.

In the present embodiment, it is described that a large substrate 701 is used to fabricate a plurality of the image pickup devices 110 at one time, but the present embodiment is not limited to this method. The image pickup devices 110 may also be fabricated one by one. In addition, the method described in the present embodiment is also applicable to fabrication of the image pickup devices disclosed in other previous embodiments.

Eighth Embodiment

Figure 14:
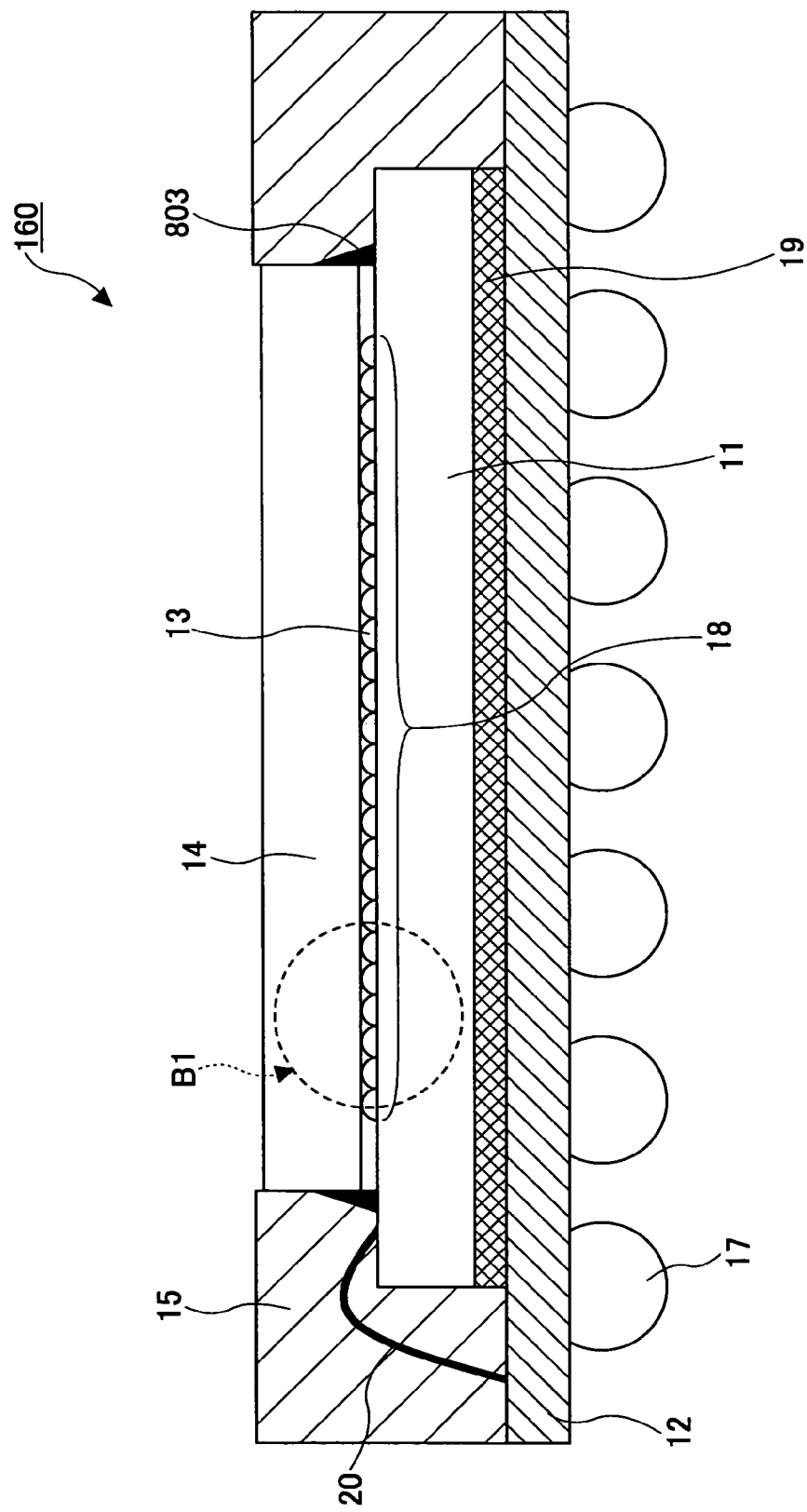
FIG. 14 is a cross-sectional view of an image pickup device 160 according to an eighth embodiment of the present invention.

FIG. 14 is a cross-sectional view of an image pickup device 160 according to an eighth embodiment of the present invention.

As illustrated in FIG. 14, in the image pickup device 160, the transparent plate 14 is directly disposed on the micro-lens 13. The primary surface of the transparent plate 14 is exposed relative to the sealing resin 15. It should be noted that a second transparent plate 16 is not present in the present embodiment.

Figure 15:
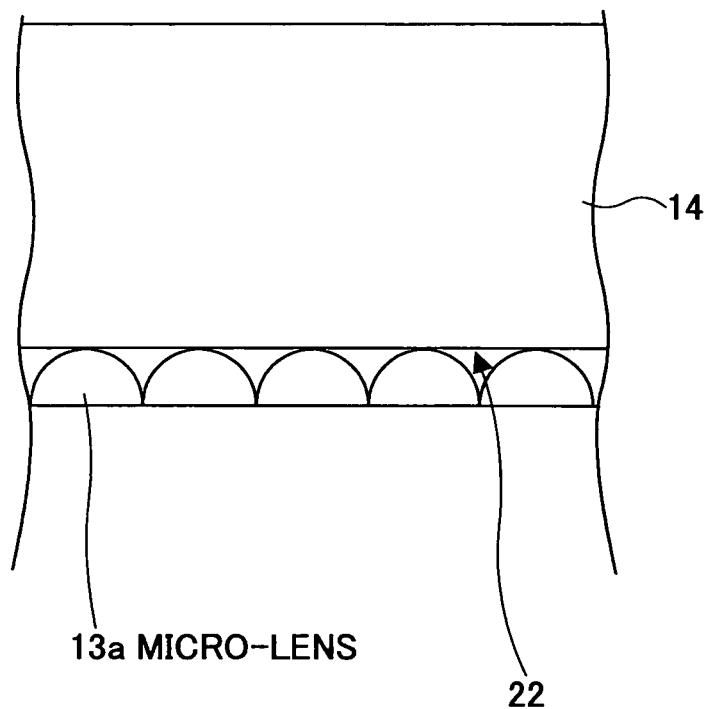
FIG. 15 is an enlarged cross-sectional view of a portion of the image pickup device 160 indicated by an arrow B1 in FIG. 14.

FIG. 15 is an enlarged cross-sectional view of a portion of the image pickup device 160 indicated by an arrow B1 in FIG. 14.

As stated above, the micro-lens 13 includes a matrix of a large number of nearly hemispherical lenses 13a facing the transparent plate 14, that is, facing the incident light.

Figure 16:
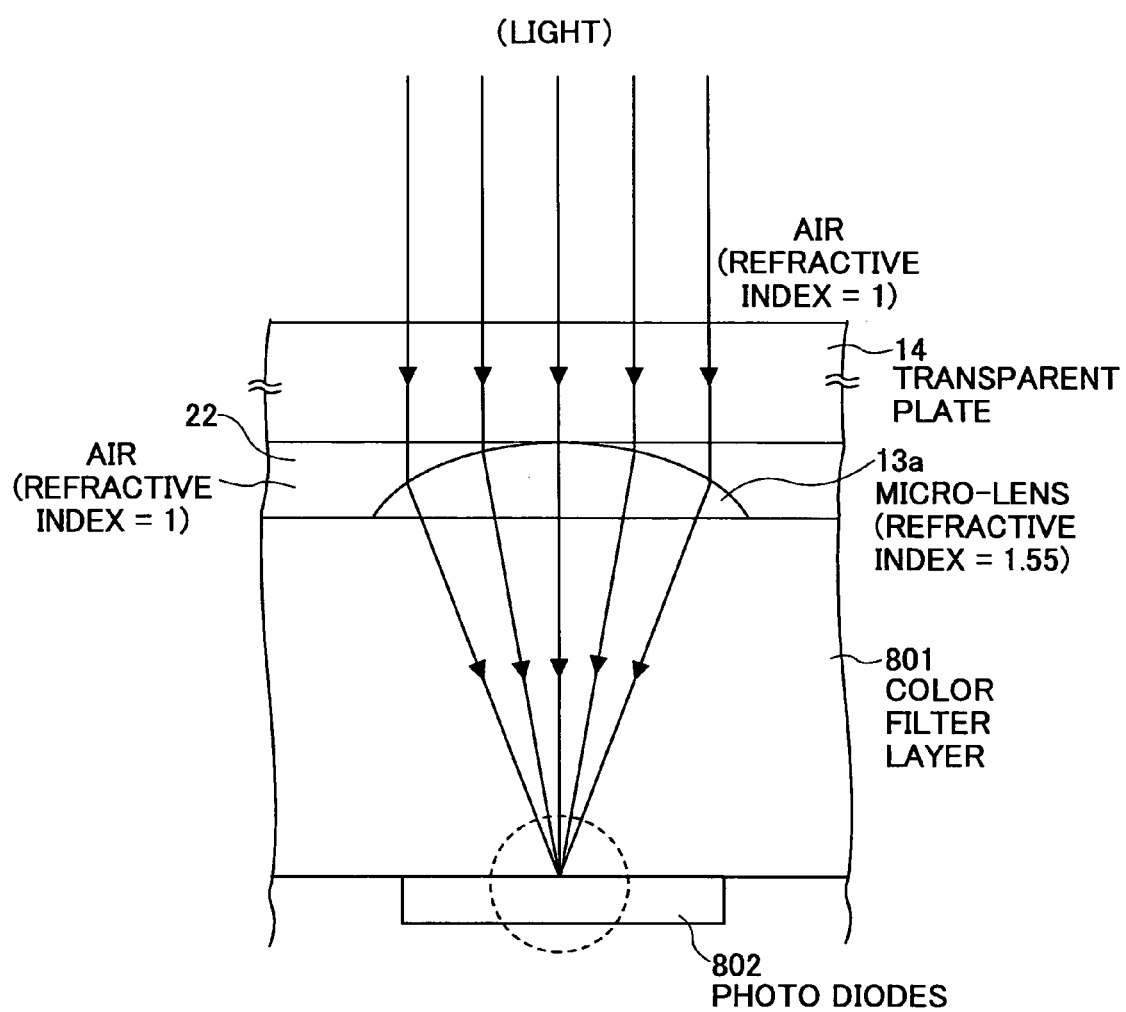
FIG. 16 is an enlarged cross-sectional view of one lens 13a of the image pickup device 160 in FIG. 14 and FIG. 15.

FIG. 16 is an enlarged cross-sectional view of one lens 13a of the image pickup device 160 in FIG. 14 and FIG. 15.

As illustrated in FIG. 16, the micro-lens 13 is disposed on the image pickup element 11 with a color filter layer 801 in between. Each lens 13a is in correspondence to a corresponding photo diode 802 on the light receiving surface of the image pickup element 11. In other words, the number of the lenses 13a is equal to or greater than the number of the photo diodes 802.

In the above structure, the transparent plate 14 is in contact with the tops of the hemispherical lenses 13a, that is, in a point-contact state, and is thus supported. In other words, the whole transparent plate 14 is supported by the micro-lens 13 (or, each hemispherical lens 13a) at many points. An adhesive agent 803 is applied surrounding the transparent plate 14 so as to be fixed to the image pickup element 11. Due to this, the transparent plate 14 does not move in the subsequent steps until the sealing resin 15 is disposed.

As stated above, in the image pickup device 160 of the present embodiment, the transparent plate 14 is directly disposed on the top ends of the lenses 13a of the micro-lens 13 (the so-called point-contact). Because the lens 13a has a curved surface, there are voids 22 between the transparent plate 14 and the lens 13a except for the contacting point, and the air may be introduced into the voids 22.

Because of the air in the voids 22, the difference of refractive indexes between the lens 13a and the surrounding space is large, and light passing through the transparent plate 14 can be reliably condensed onto the photo diode, preventing output loss of the image pickup device 160.

Because the transparent plate 14 is supported by a large number of the lenses 13a at many points, the loads imposed on those lenses 13a are nearly the same, therefore, irregularity in optical characteristics of specific lenses 13a does not occur, and degradation of performance of the image pickup device 160 does not occur.

Ninth Embodiment

Figure 17:
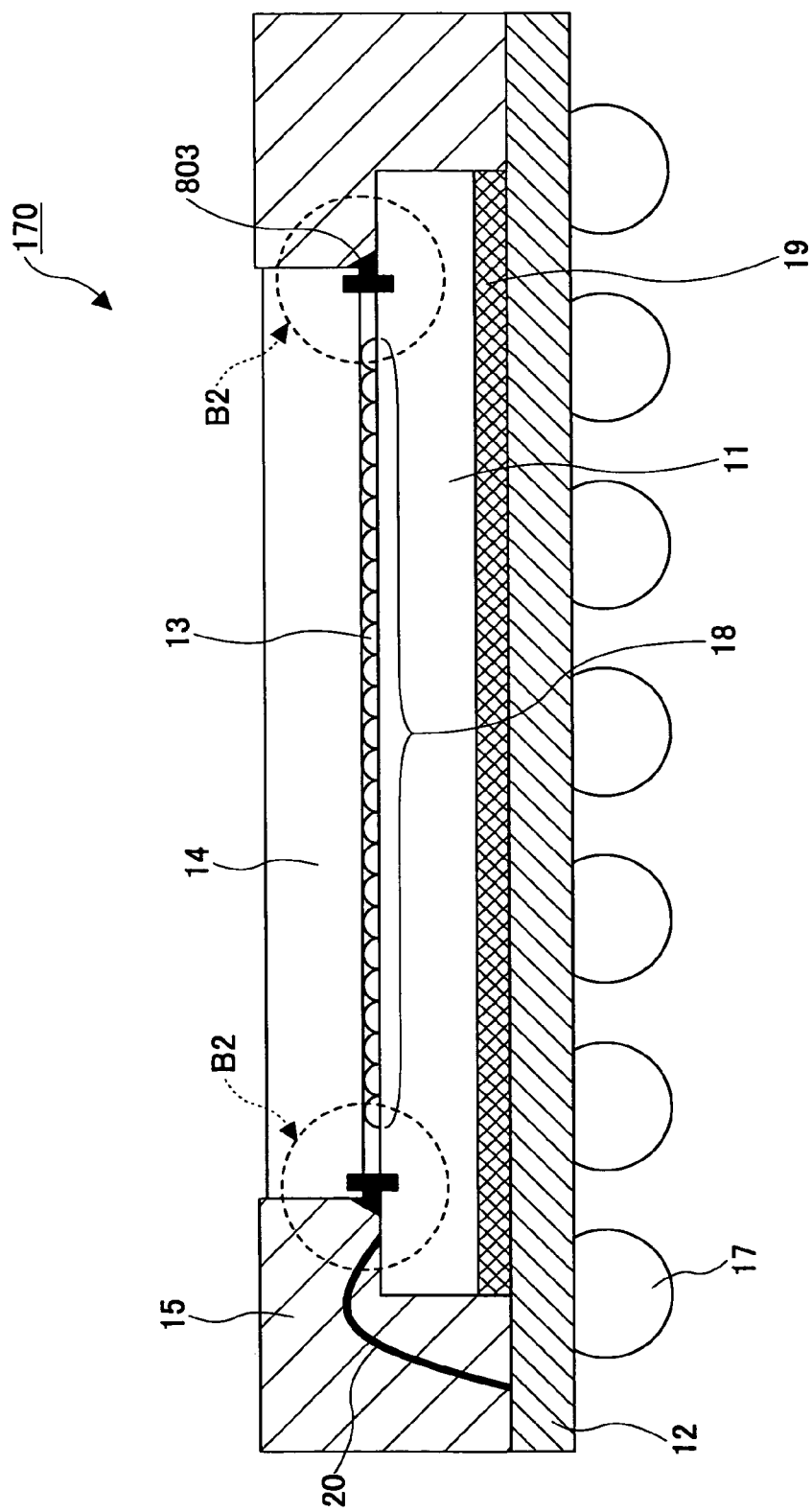
FIG. 17 is a cross-sectional view of an image pickup device according to a ninth embodiment of the present invention.

FIG. 17 is a cross-sectional view of an image pickup device 170 according to a ninth embodiment of the present invention.

Figure 18:
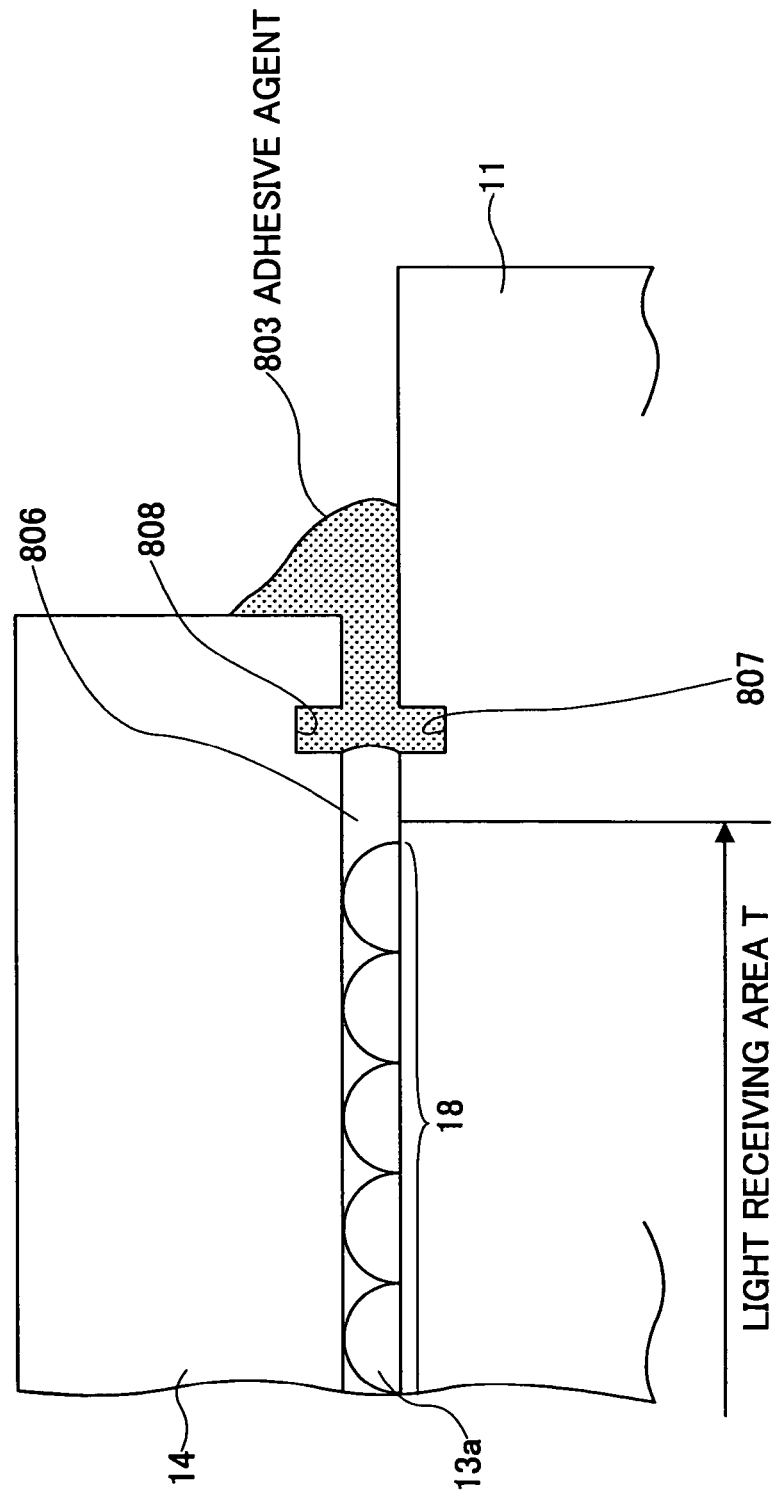
FIG. 18 is an enlarged cross-sectional view of a portion of the image pickup device indicated by arrows B2 in FIG. 17.

FIG. 18 is an enlarged cross-sectional view of a portion of the image pickup device 170 indicated by arrows B2 in FIG. 17.

As illustrated in FIG. 17 and FIG. 18, the structure of the image pickup device 170 is basically the same as that of the image pickup device 160 in FIG. 14, except that in the image pickup device 170, a groove 807 is formed on the image pickup element 11 at a place where the adhesive agent 803 is applied (portions of the image pickup device 170 indicated by arrows B2 in FIG. 17), and a groove 808 is formed on the transparent plate 14 at a position facing the groove 807, that is, at the place where the adhesive agent 803 is applied.

As illustrated in FIG. 18, the transparent plate 14 is directly disposed on the micro-lens 13, and there are small voids 806 between the transparent plate 14 and the image pickup element 11.

Generally, the adhesive agent 803 surrounding the transparent plate 14 on the image pickup element 11 is liquid when being applied. On account of the capillary phenomenon, the adhesive agent 803 probably flows through the voids 806 and arrives in the micro-lens 13. If this adhesive agent 803 intrudes into the light receiving area of the micro-lens 13, the optical characteristics of the image pickup element 11 may decline.

In the present embodiment, because the grooves 807 and 808, which are opposite to each other, are formed on the image pickup element 11 and the transparent plate 14, surrounding the light receiving areas of the micro-lens 13 and the image pickup element 11, these grooves 807 and 808 prevent flow of the liquid adhesive agent 803 caused by the capillary phenomenon, and thus prevents contamination of the light receiving area of the micro-lens 13 by the adhesive agent 803.

In addition to preventing the flow of the liquid adhesive agent 803 caused by the capillary phenomenon, the grooves 807 and 808 also act as adhesive agent containers to collect the liquid adhesive agent 803.

Therefore, according to the present embodiment, it is possible to prevent degradation of the optical characteristics of the image pickup device 170.

It is described above that grooves are formed on both of the image pickup element 11 and the transparent plate 14, but the grooves may also be formed on either the image pickup element 11 or the transparent plate 14.

10th Embodiment

Figure 19:
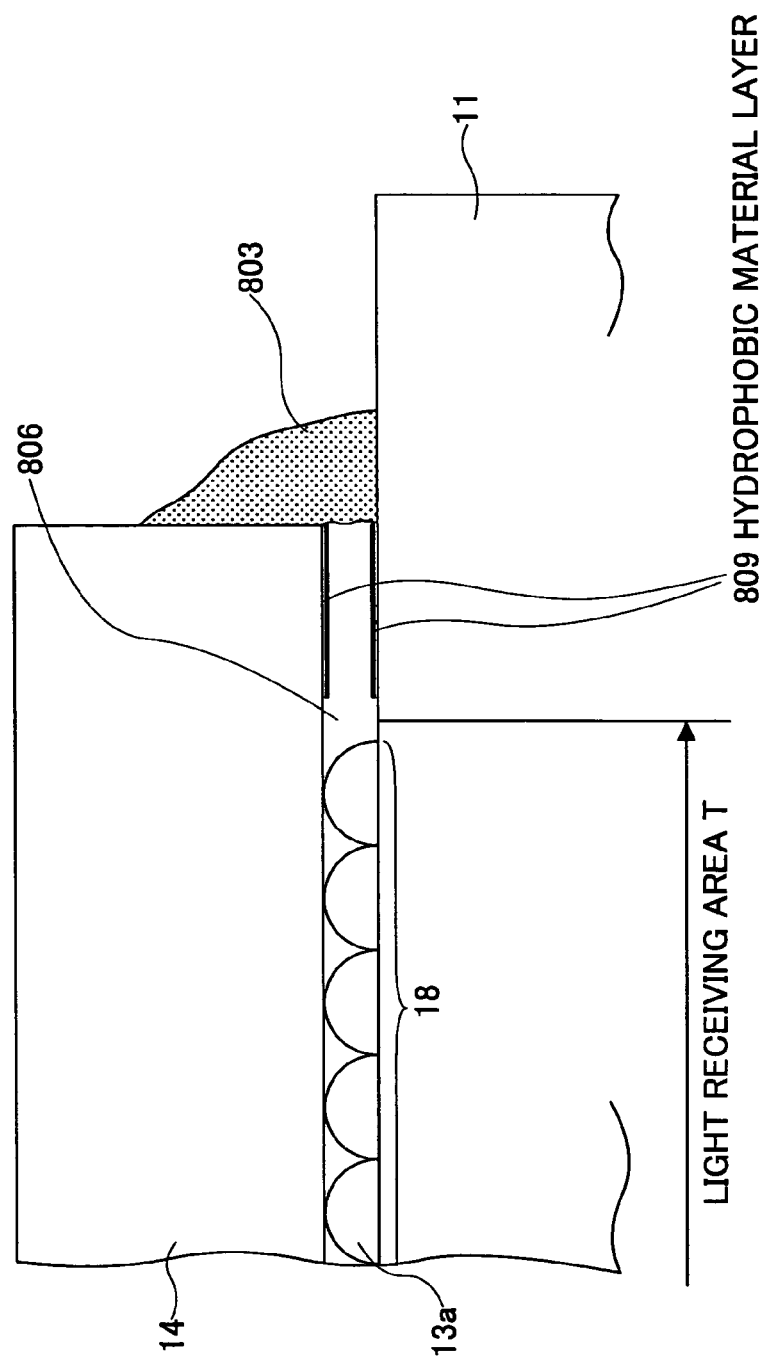
FIG. 19 is an enlarged cross-sectional view of a portion of an image pickup device according to a 10th embodiment of the present invention.

FIG. 19 is an enlarged cross-sectional view of a portion of an image pickup device according to a 10th embodiment of the present invention, specifically, a portion with the adhesive agent 83 being applied, as indicated by arrows B2 in FIG. 17.

As illustrated in FIG. 19, in the image pickup device according to the present embodiment, instead of the grooves 807 and 808, a layer 809 of hydrophobic material is provided at opposite positions on the image pickup element 11 and the transparent plate 14, where the adhesive agent 803 is applied.

For example, the hydrophobic material may be HMDS (HexaMethylDiSilazane), and this material may be selectively coated at the adhesive agent application positions on the image pickup element 11 and the transparent plate 14, thereby, forming the hydrophobic material layer 809.

Because of the hydrophobicity of the hydrophobic material layer 809, it is possible to prevent intrusion of the adhesive agent 803 into the voids 806 between the transparent plate 14 and the image pickup element 11, thus preventing contamination of the light receiving area of the micro-lens 13 by the adhesive agent 803, and ensuring the reliability of the image pickup device.

11th Embodiment

Figure 20:
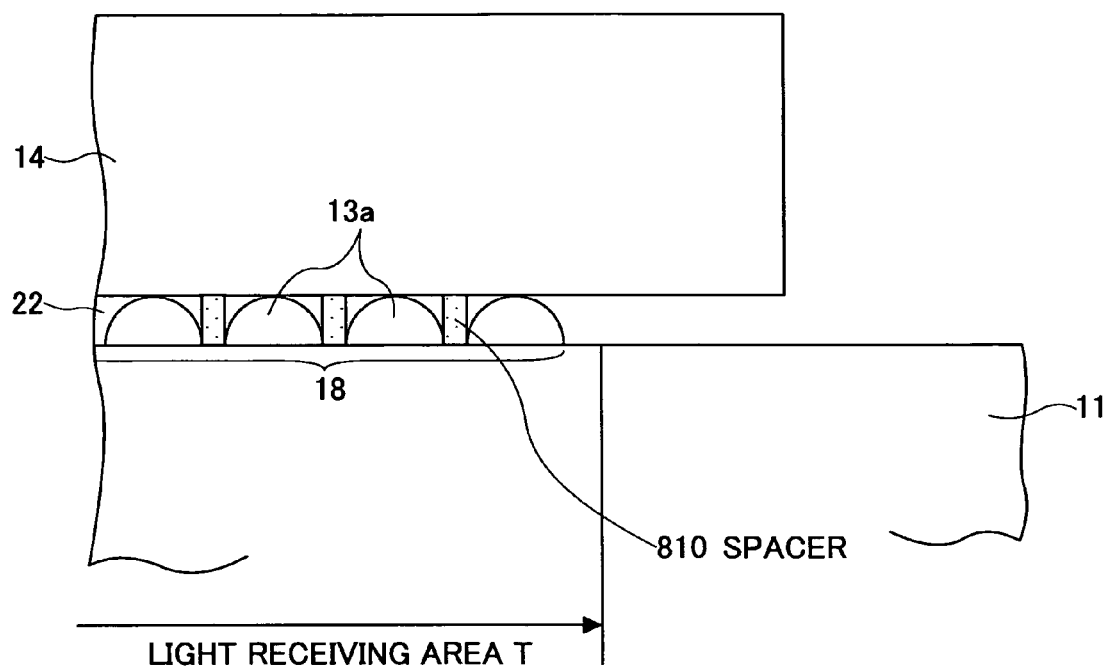
FIG. 20 is an enlarged cross-sectional view of an image pickup device according to an 11th embodiment of the present invention, illustrating a portion of the image pickup device where the transparent plate and the micro-lens face each other.

FIG. 20 is an enlarged cross-sectional view of an image pickup device according to an 11th embodiment of the present invention, illustrating a portion of the image pickup device where the transparent plate 14 and the micro-lens 13 face each other.

As illustrated in FIG. 20, in the image pickup device according to the present embodiment, spacers 810 are arranged between the transparent plate 14 and the micro-lens 13, and the transparent plate 14 is supported on the micro-lens 13 by the spacers 810.

For example, the spacers 810 are formed from photo resist, each having a height a little bit greater than the lenses 13a of the micro-lens 13.

Figure 21:
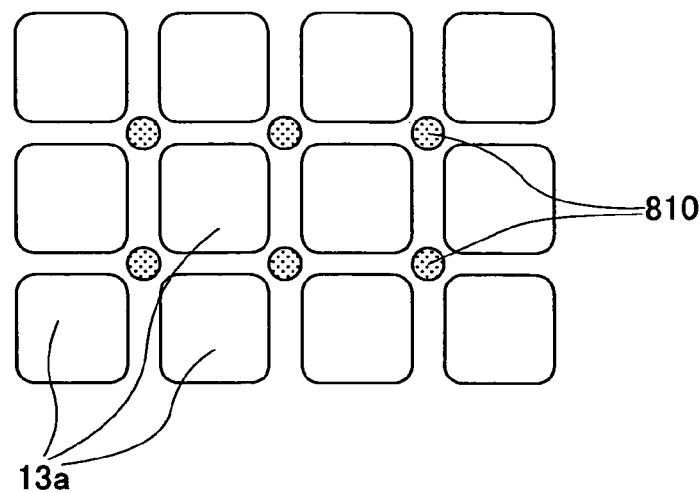
FIG. 21 is a plan view of a portion of the image pickup device according to the 11th embodiment, illustrating an example of an arrangement of spacers.

FIG. 21 is a plan view of a portion of the image pickup device according to the present embodiment, illustrating an example of an arrangement of spacers 810.

As illustrated in FIG. 21, the spacers 810 are columnar and are arranged between adjacent lenses 13a.

Because of the spacers 810, the transparent plate 14 can be reliably supported on the image pickup element 11. In addition, because voids exist between the spacers 810 and the micro-lens 13, air may be introduced into the voids. Thus, the difference of refractive indexes between the lens 13a and the surrounding space is large, and the incident light can be reliably condensed onto the photo diode, preventing output loss of the image pickup device.

Figure 22:
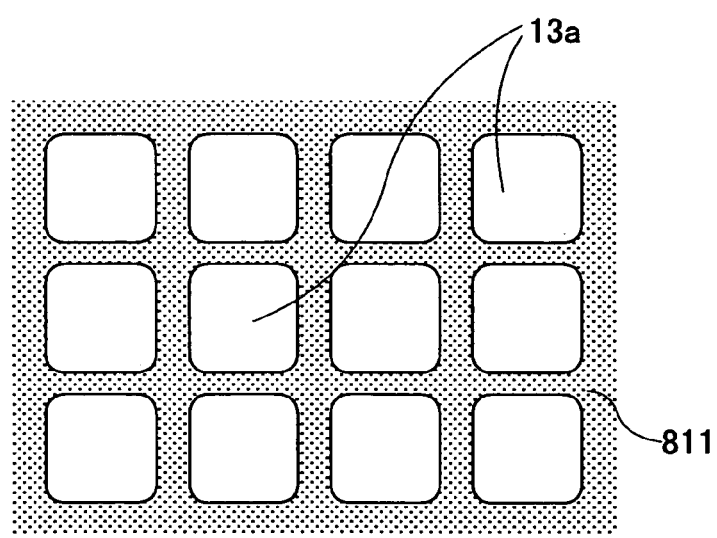
FIG. 22 is a plan view of a portion of the image pickup device according to the 11th embodiment, illustrating another example of the arrangement of spacers.

FIG. 22 is a plan view of a portion of the image pickup device according to the present embodiment, illustrating another example of the arrangement of spacers 811.

As illustrated in FIG. 22, the spacers 811 are formed like walls between adjacent lenses 13a. Because of the spacers 811, the transparent plate 14 can be reliably supported on the image pickup element 11, and the incident light can be reliably condensed onto the photo diode. Furthermore, because of the wall-shaped spacers 811, the light receiving surface is segmented corresponding to each photo diode, and this prevents interference of light between adjacent photo diodes.

While the invention is described above with reference to specific embodiments chosen for purpose of illustration, it should be apparent that the invention is not limited to these embodiments, but numerous modifications could be made thereto by those skilled in the art without departing from the basic concept and scope of the invention.

According to the present invention, it is possible to provide an image pickup device having high performance of light entrance and little deformation, and thus having high performance of image pickup.

What is claimed is:

1. An image pickup device, comprising:
an image pickup element having a light receiving surface;
a lens arranged on the light receiving surface;
a first transparent plate made of a glass material disposed over the lens on the light receiving surface of the image pickup element, but not directly contacting the light receiving surface, the first transparent plate having a surface, the surface facing the lens, and the surface being flat at least at a position directly above a position of the lens, wherein a substance different from both the first transparent plate and the lens is in existence between the surface of the first transparent plate and the lens;
a transparent material disposed on an upper surface of the first transparent plate and that seals the image pickup element; and
a second transparent plate made of a glass material directly contacting an upper surface of the transparent material,
wherein the light receiving surface includes a photodiode, and light incident from outside the image pickup device reaches the photodiode through the lens after passing through the first transparent plate, and
wherein the lens, the first transparent plate, and the second transparent plate are arranged in the following order: the lens, the first transparent plate, and the second transparent plate.

2. The image pickup device as claimed in claim 1, wherein a surface area of the second transparent plate is greater than a surface area of the first transparent plate.

3. The image pickup device as claimed in claim 1, wherein air is disposed between the first transparent plate and the image pickup element.

4. The image pickup device as claimed in claim 1, wherein a light transmission adhesive material is disposed between the first transparent plate and the image pickup element.

5. The image pickup device as claimed in claim 1, wherein the first transparent plate is in direct contact with at least a portion of the lens.

6. The image pickup device as claimed in claim 1, wherein the second transparent plate is in contact with the first transparent plate.

7. The image pickup device as claimed in claim 1, wherein the transparent material is interposed between the first transparent plate and the second transparent plate.

8. The image pickup device as claimed in claim 1, wherein the transparent material is a resin.

9. A method of producing an image pickup device, comprising:
disposing an image pickup element having a light receiving surface on a substrate;
disposing a lens on the light receiving surface;
disposing a first transparent plate made of a glass material on the image pickup element and over the lens, the first transparent plate having a surface, the surface facing the lens, and the surface being flat at least at a position directly above a position of the lens, wherein a substance different from both the first transparent plate and the lens is in existence between the surface of the first transparent plate and the lens;

connecting the image pickup element with an electrode arranged on the substrate;

arranging a second transparent plate made of a glass material in a mold;

arranging the substrate on which the image pickup element and the first transparent plate are disposed so that the first transparent plate faces the second transparent plate; and sealing the image pickup element and an upper surface of the first transparent plate with a transparent material so that the second transparent plate faces the first transparent plate across the material, wherein the light receiving surface includes a photodiode, and light incident from outside the image pickup device reaches the photodiode through the lens after passing through the first transparent plate, and wherein the lens, the first transparent plate, and the second transparent plate are arranged in the following order: the lens, the first transparent plate, and the second transparent plate.

10. The method as claimed in claim 9, wherein the transparent material is interposed between the first transparent plate and the second transparent plate in the produced image pickup device.

11. The method as claimed in claim 9, wherein the transparent material is a resin.

* * * * *